United States Patent [19]

Uchida et al.

[11] 4,258,122

[45] Mar. 24, 1981

[54] PROCESS FOR PREPARING LITHOGRAPHIC PRINTING PLATE USING SILICATE CONTAINING-DESENSITIZER

[75] Inventors: Toshio Uchida; Yorimiti Yabuta; Hiromichi Tachikawa; Teppei Ikeda, all of Asaka, Japan

[73] Assignee: Fuji Photo Film Co., Ltd., Minami-ashigara, Japan

[21] Appl. No.: 920,872

[22] Filed: Jun. 30, 1978

[30] Foreign Application Priority Data

Jun. 30, 1977 [JP] Japan ................................. 52-78316

[51] Int. Cl.$^2$ ................................................ G03F 7/02

[52] U.S. Cl. .................................... 430/253; 101/455; 101/456; 101/465; 430/302; 430/309

[58] Field of Search ........................ 96/33, 35.1, 48 R; 106/2; 101/456, 465, 455; 430/302, 309, 253

[56] References Cited

U.S. PATENT DOCUMENTS

| | | | |
|---|---|---|---|
| 3,199,981 | 8/1965 | Süs et al. | 96/33 |
| 3,264,104 | 8/1966 | Reichel et al. | 96/33 |
| 3,489,561 | 1/1970 | Pickard | 96/33 |
| 3,568,598 | 3/1971 | Abbot et al. | 101/456 X |
| 3,615,480 | 10/1971 | Lam et al. | 96/48 |
| 3,619,217 | 11/1971 | West | 106/2 |
| 3,627,529 | 12/1971 | Frank et al. | 430/253 |
| 3,679,043 | 10/1972 | Morishima et al. | 106/2 |
| 3,696,746 | 10/1972 | Harper | 101/465 |
| 3,698,904 | 10/1972 | Fukui et al. | 96/48 |
| 3,707,373 | 12/1972 | Martinson et al. | 96/35.1 |
| 3,738,850 | 6/1973 | Radell et al. | 106/2 |
| 3,745,028 | 7/1973 | Rauner | 106/2 |
| 3,759,850 | 9/1973 | Lehman | 96/33 X |
| 3,924,520 | 12/1975 | Boardman et al. | 96/33 |
| 3,971,660 | 7/1976 | Staehle | 96/33 |
| 4,157,261 | 6/1979 | Takeda | 430/253 |
| 4,175,964 | 11/1979 | Uchida et al. | 430/253 |

*Primary Examiner*—Edward C. Kimlin
*Attorney, Agent, or Firm*—Sughrue, Rothwell, Mion, Zinn and Macpeak

[57] ABSTRACT

A desensitizer for a lithographic printing plate, which contains:

(i) at least one silicate represented by the general formulae (I), (II) and (III)

$$M_2O.(SiO_2)_n.qH_2O \quad (I)$$

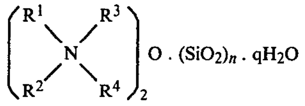

(II)

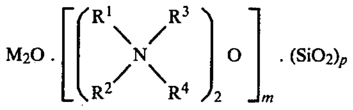

(III)

wherein M represents an alkali metal atom; $R^1$, $R^2$, $R^3$ and $R^4$, which may be the same or different, each represents a hydrogen atom, an alkyl group or a hydroxyalkyl group; n represents a number of from 1 to 8.5; q represents a number of from 0 to 12; m represents a number of greater than 0 and up to 10; and p represents a number of from 4 to 5000;

(ii) at least one wetting agent;

(iii) a hydrophilic colloidal material; and (iv) water, and a process for preparing a lithographic printing plate using the desensitizer.

17 Claims, 2 Drawing Figures

PROCESS FOR PREPARING LITHOGRAPHIC PRINTING PLATE USING SILICATE CONTAINING-DESENSITIZER

BACKGROUND OF THE INVENTION

1. Field of the Invention

The present invention relates to a desensitizer for a lithographic printing plate and to a process for preparing a lithographic printing plate using the same and, more particularly, it relates to a desensitizer suitable for a lithographic printing plate prepared from a peel-apart developable light-sensitive lithographic printing plate material wherein a support, a photo-hardenable light-sensitive layer and a peel-apart transparent cover film are present in this order as necessary components, and to a process for preparing a lithographic printing plate using the same.

2. Description of the Prior Art

Recently, various types of light-sensitive lithographic printing plate materials have been developed. In particular, materials using a photo-polymerizable composition (a so-called light-sensitive resin, photo-polymer or photoresist) as a light-sensitive layer are known as light-sensitive printing plate materials having the advantages that imagewise exposure and development processing can easily be conducted, that the time necessary for the development and subsequent treatment up to printing is short, that development can be conducted in a stable manner, that the printed images accurately reproduce the original image, that they can be stored for a long time as a light-sensitive material, and that the lithographic printing plate produced, has an excellent durability enabling many impressions to be printed.

Illustrative photopolymers which can be used in these printing plates include those which contain a photodimerization type light-sensitive resin as a major component, such as a polyester of p-phenylene diacrylate and 1,4-cyclohexanediol as described in Belgian Pat. No. 696,533, and a reaction product between a phenoxy resin and cinnamic acid or a carboxylic acid having one or more unsaturated groups as described in U.S. Pat. No. 3,387,976; those which contain a polymerizable compound having an ethylenically unsaturated bond and a binder (polymer) as major components, such as those which contain a photo-polymerizable material represented by the combination of an ethylenically unsaturated compound (e.g., diethylene glycol diacrylate, triethylene glycol dimethacrylate, pentaerythritol triacrylate, etc. as described in U.S. Pat. No. 3,043,805) and a binding agent (e.g., a methyl methacrylate/methacrylic acid copolymer, a styrene/itaconic acid copolymer, etc.) as major components.

Light-sensitive lithographic printing plates having these photo-polymers are imagewise exposed through an original image with a desired negative pattern, and developed using a suitable developer of an organic solvent, an alkaline aqueous solution or the like. Thus, the ultraviolet light irradiated areas remain on the plate support and the unexposed areas are dissolved and removed with the developer to form a pattern or dots of an original for printing on the plate support. Thus, lithographic printing plates are prepared.

In recent years, recording materials capable of being developed in a dry process have been proposed in place of such solution-developing type printing plate materials. Of these materials, those described in Japanese Pat. No. 9,663/63, U.S. Pat. No. 3,353,955, British Pat. No.

1,360,081 and Japanese patent application (OPI) No. 46,315/75 (The term "OPI" as used herein refers to a "published unexamined Japanese patent application".) utilize the photo-polymerizable property of a photopolymer and the change in adhesiveness due to the photo-polymerization. In these recording materials, a layer of a photo-polymerizable composition containing as major components a polymer (as a binder), an unsaturated monomer and a photo-polymerization initiator is provided on a synthetic resin film, metal, paper or like support, and a thin transparent film is superposed thereon as a cover. Printing plates are prepared from such a material by imagewise exposing the material through the cover, and then stripping or peeling off (delaminating) the cover therefrom to thereby leave either the exposed areas or unexposed areas of the light-sensitive layer on the support and the other areas on the cover, resulting in the formation of a negative image and a positive image (or a positive image and a negative image) on the support and the cover, respectively.

Examples of utilizing peel-apart developable light-sensitive materials using such a photo-polymerizable composition are described in Japanese patent application (OPI) Nos. 9,501/77 and 66,353/76.

Heretofore, a "desensitization (treatment)" has been generally used in the same sense as an "etching (treatment)" in the step of making an albumen plate or a deep-etch plate. The object of desensitization is to improve the hydrophilic property in the non-image areas, and a solution containing gum arabic and phosphoric acid as major components is often used as the desensitizer. After this desensitizing treatment, gumming with a solution containing gum arabic as a major component is usually conducted to protect the non-image areas.

On the other hand, with lighographic printing plates, non-image areas are usually densensitized, after development, with a solution of a hydrophilic, water-soluble and filmforming colloid like gum arabic. This desensitizing treatment renders the non-image areas highly hydrophilic, quite water-receptive, and oily ink-repellent in the presence of water.

This desensitizing treatment is based on the idea of (1) completely removing the light-sensitive layer which has not been removed on development, (2) rendering the metallic surface hydrophilic through a chemical treatment, and (3) enhancing the hydrophilicity of the metallic surface by adsorbing a hydrophilic colloid thereon. More specifically, a Cronak treatment, a Post-Nital treatment, a Brunak treatment, an etching solution treatment, a treatment with a hydrophilic colloid such as gum arabic, carboxymethyl cellulose, etc., or a combination of these treatments is often employed. This desensitizing treatment for deep-etch plates and plates which have been previously rendered light sensitive [presensitized (PS) plates] differs slightly. With deep-etch plates, counter-etching treatment with acetic acid or the like is conducted prior to coating a light-sensitive solution on the plate and, after plate-making, desensitization treatment is conducted by etching with a solution of a mixture of phosphoric acid and gum arabic. On the other hand, with PS plates, treatments for preventing a reaction between the light-sensitive layer and the aluminum surface are conducted. An alumite treatment, treatment with an aqueous zirconium fluoride solution, and treatment with an aqueous sodium silicate solution as described in U.S. Pat. No. 2,714,066 have been put into practice. In every case, the treatment is conducted before coating a light-sensitive solution on the plate. With PS plates too, gum-coating and desensitization with an aqueous solution of gum arabic alone are often conducted, after plate-making, as with deep-etch plates.

The objects of gumming are not only to protect the hydrophilicity of the non-image areas but to correct image areas such as retouching or elimination, to enable the plate to be stored after plate-making and before printing or to be stored for re-use, to prevent stains caused by adhesion of finger-prints, oils and fats, dirt, etc. during handling and mounting on a printing machine, to prevent formation of flaws or scratches, etc., and to control oxidation stains formed when the printing machines are stopped due to some difficulty or during rest periods.

Oxidation staining is the phenomenon of oxidation of the surface of the printing plate when the metallic surface of a printing plate comprising a metal plate, such as aluminum or zinc, is uncovered for a long time during the plate-making steps or printing steps, the surface is oxidized to form spot-like ink stains during printing, which can be prevented by gumming.

However, gumming using the conventional gum solution (desensitizer) described above is not completely satisfactory for peel-apart developable lithographic printing plates. The reasons for this are as follows. That is, when peel-apart developable lithographic printing plates are stored for a long time, innumerable "stain-like spots" are often formed in the non-image areas after imagewise exposure and development. The reason for this may be because a peel-apart developable type light-sensitive composition contains in many cases a hydrophobic liquid additive such as an ethylenically unsaturated monomer, and this liquid additive such as the monomer penetrates with time, when applied to a hydrophilic support for a lithographic plate, into the grains or fine pores on the surface of the hydrophilic support causing innumerable spotted stains on the surface of the hydrophilic support. Non-image areas must essentially be hydrophilic but, areas where such stains are formed are no longer hydrophilic and such stains cannot be removed or the areas cannot be rendered hydrophilic using a conventional gum solution which has the property of only forming a hydrophilic membrane on a printing plate. Therefore, when printing is conducted using a lithographic printing plate bearing such stains, serious printing stains will result (all over the surface).

In order to further increase the durability of a peel-apart developing type light-sensitive lithographic printing plate to meet the requirements for printing plates with high durability, the known process of irradiating the entire plate surface with actinic light after formation of printing images, a so-called post-exposure (or re-exposure), is effective.

In general, with solvent- or solution-developing type light-sensitive resin printing plates, it has been proposed, in order to obtain plates with an enhanced durability, to re-irradiate with actinic light (post-exposure) the entire light-sensitive resin printing plate, which has previously been subjected to image-forming exposure and to a treatment to dissolve away the unexposed areas, to further polymerize and complete hardening thereby increasing the hardness of the image areas. However, in post-treatment by post-exposure, the photo-hardening reaction is generally inhibited by oxygen in the air, and hence a mere irradiation of the plate surface with actinic light is not sufficient to completely harden the printing image areas and does not improve the durability of the printing plate.

Several methods have heretofore been proposed for removing these disadvantages. For example, a process of conducting the post-exposure in an inert gas such as carbon dioxide or nitrogen has been proposed. In this process, however, a gas-tight apparatus must be used, and a replacement of the atmosphere therein with the inert gas is necessary every time plates are changed. Therefore, this process is troublesome to conduct and is not an industrially practical process.

On imagewise exposing a peel-apart developable type PS plate, peel-apart developing the plate and irradiating the entire printing plate with actinic light (post-exposure), the following problems specific to peel-apart developable type PS plates are involved.

(1) When actinic light is applied in the presence of oxygen such as that in the air, polymerization is inhibited to such an extent due to the influence of oxygen that the effects of the actinic light can be scarcely obtained even when the irradiation is conducted for a long time.

(2) When irradiation with actinic light is conducted while eliminating the effects of oxygen, for example, in vacuo or in an atmosphere of carbon dioxide or nitrogen, polymerization proceeds in the image areas and, at the same time, polymerization of the light-sensitive composition or a thin layer comprising the light-sensitive composition which remains to some extent in the non-image areas takes place, and a strong oleophilic membrane is formed in the non-image areas. This results in extremely serious ink stains all over the plate surface when the plate is used for printing.

(3) The stains as described in (2) above are not generated when the irradiation with actinic light is conducted in an atmosphere as in (2) above after removing the remaining thin layer in the non-image areas with an organic solvent or the like. However, such a solution treatment after the peel-apart developing increases the number of development treatment steps and eliminates to a large extent the advantages of a peel-apart developing process as a dry process.

As a post-exposure process for removing the abovedescribed defects, the process of conducting the irradiation of the (lithographic) plate surface with actinic light, after peel-apart developing, in the presence of oxygen under heating, as described in Japanese patent application (OPI) No. 15,906/78, has been previously proposed.

However, this process has the defect that, since re-exposure is conducted without forming a hydrophilic membrane on a peel-apart developed lithographic plate, the plate cannot be subjected to a gumming treatment (for forming a hydrophilic membrane) immediately after the development as with ordinary PS plates or like plates. That is, when a peel-apart developable type PS plate is imagewise exposed, peel-apart developed and gummed with a gum commonly used for lithographic plates (e.g., a gum arabic aqueous solution) to provide a gum membrane on the lithographic plate surface, this gum membrane intercepts oxygen in the air upon post-exposure. Thus, the same problems as in (2) above occurs as to post-exposure. The image areas on the plate truely undergo sufficient photo-hardening but, at the same time, the components of the light-sensitive layer which remain to some extent in the non-image areas also undergo photo-polymerization, resulting in the non-image areas becoming oleophilic, which will cause undesirable printing stains.

Under such circumstances, development of a gum solution (desensitizer) which does not cause stains even when gumming is conducted immediately after peel-apart developing a peel-apart developable type PS plate and then post-exposure is conducted, and a process for post-exposing with sufficient post-exposure effects has been desired.

SUMMARY OF THE INVENTION

As a result of intensive investigations to solve the above-described problems, a desensitizer with a specific composition which can be coated all over the lithographic plate after peel-apart developing, which does not cause printing stains in the non-image areas and which provides sufficient post-exposure effects, even when the entire plate is irradiated with actinic light after coating the desensitizer on the plate, has now been discovered and the present invention has been achieved.

An object of the present invention is to provide a desensitizer which is also applicable to a peel-apart developable type light-sensitive lithographic printing plate and a process of post-exposure providing sufficient post-exposure effects.

Another object of the present invention is to provide a desensitizer having the ability to markedly enhance the degree of hydrophilicity rendered as compared with conventional desensitizers.

A further object of the present invention is to provide a desensitizer with which the amount of paper wasted in starting printing is reduced even when printing is started without removing the gum immediately before printing, i.e., which has an excellent properties for starting printing.

Still a further object of the present invention is to provide a desensitizer providing an excellent stain-removing ability and desensitizing action on not only peel-apart developable type PS plates but also all lithographic printing plates.

Still a further object of the present invention is to provide a desensitizer which has the function of both desensitization and gumming, and a process for treating a lithographic printing plate using the same.

The present invention provides (1) a desensitizer for lithographic printing plates containing (i) at least one silicate represented by the general formulae (I), (II) and (III)

$$M_2O.(SiO_2)_n.qH_2O \quad (I)$$

(II)

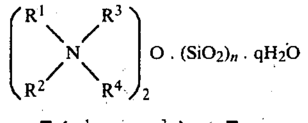

(III)

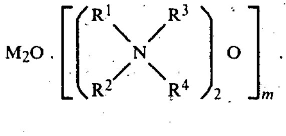

wherein M represents an alkali metal atom; $R^1$, $R^2$, $R^3$ and $R^4$, which may be the same or different, each represents a hydrogen atom, an alkyl group or a hydroxyalkyl group; n represents a number of from 1 to 8.5; q represents a number of from 0 to 12; m represents a number of greater than 0 and up to 10; and p represents a number of from 4 to 5000; (ii) at least one wetting agent, (iii) a hydrophilic colloid material, and (iv) water, and (2) a process for preparing a lithographic printing plate which comprises imagewise exposing a light-sensitive lithographic printing plate material comprising a support having thereon a photo-hardenable light-sensitive layer with actinic light and developing the imagewise exposed lithographic printing plate material to form a lithographic printing plate with oily ink-receptive printing image areas therein, and applying the desensitizer for lithographic printing plates described in (1) above to the entire surface of the lithographic printing plate having the oily ink-receptive printing images therein, then irradiating the entire surface of the lithographic printing plate with actinic light.

BRIEF DESCRIPTION OF THE ACCOMPANYING DRAWINGS

FIGS. 1 and 2 are flow sheets showing the processing procedures followed respectively in Examples 2 and 4 given hereinafter.

DETAILED DESCRIPTION OF THE INVENTION

Figure 1:
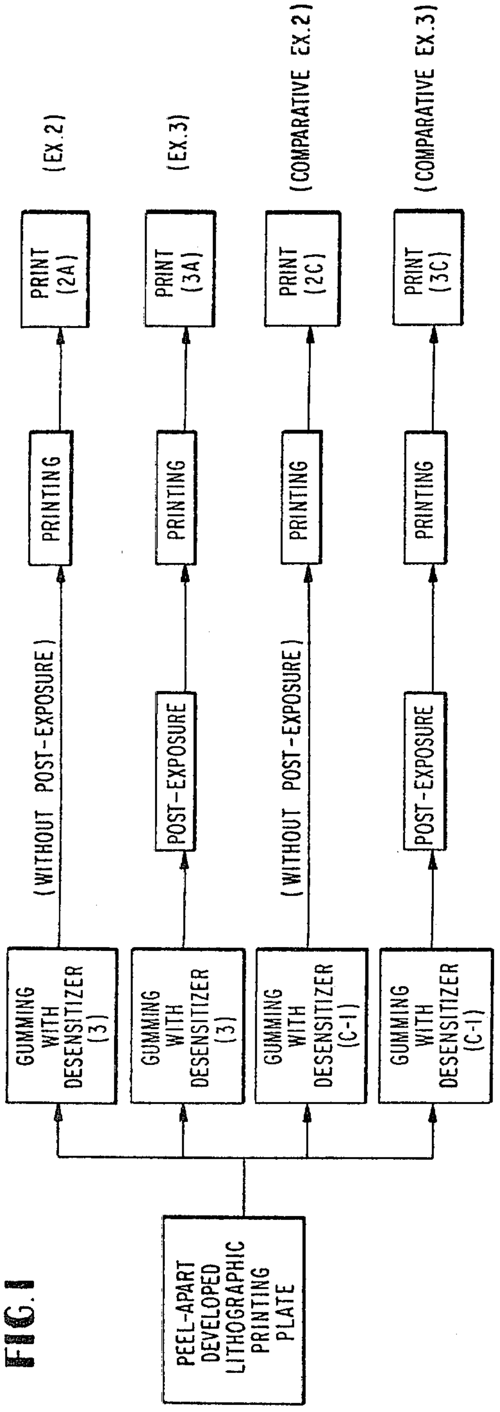

The first component of the desensitizer of the present invention for lithographic printing plates is a silicate represented by the general formula (I), (II) or (III), which includes water-soluble silicates and water-insoluble colloidal particles having a mean particle size of 5 nm to 300 nm. In the desensitizer, the first component renders the lithographic printing plate surface hydrophilic, maintains the desensitizer alkaline, and prevents the light-sensitive layer components remaining to some extent in the non-image areas of the lithographic printing plate surface from being hardened or set with light. Thus the silicate is a fundamental component of the desensitizer of the present invention for lithographic printing plates.

In the general formulae (I) and (III), M represents an alkali metal atom, and specific examples thereof include lithium, sodium, potassium, rubidium, cesium and francium, with lithium, sodium and potassium being preferred. In the general formula (II), $R^1$, $R^2$, $R^3$ and $R^4$ each represents a hydrogen atom, an alkyl group or a hydroxyalkyl group. Suitable alkyl groups are lower alkyl groups having 1 to 5 carbon atoms, and specific examples thereof include a methyl group, an ethyl group, a propyl group, an isopropyl group, a butyl group, and a pentyl group. Of these, a methyl group and an ethyl group are preferred. Suitable hydroxyalkyl groups are hydroxyalkyl groups having 1 to 5 carbon atoms, and specific examples thereof include a hydroxymethyl group, a 2-hydroxyethyl group, a 1-hydroxyethyl group, a 3-hydroxypropyl group, a 2-hydroxypropyl group, a 4-hydroxybutyl group, a 5-hydroxypentyl group and a 4-hydroxy-2-methylbutyl group. Of these, a hydroxymethyl group, a 2-hydroxyethyl group and a 1-hydroxyethyl group are preferred. Additionally, $R^1$, $R^2$, $R^3$ and $R^4$ may be the same or different but, from the point of view of availability and expense, those silicates wherein $R^1$ through $R^4$ are the same are preferred.

Specific examples of silicates represented by the general formula (I) are sodium silicate, lithium silicate, potassium silicate, rubidium silicate, and cesium silicate. The ratio of silica (silicon dioxide) to alkali metal oxide, n, in these silicates ranges up to about n=8.5. In the present invention, silicates where n is 1 or more, i.e., $1 \leqq n \leqq 8.5$ can be used. Specific examples of suitable silicates include sodium silicate (n=2.1-3.3), potassium silicate (n=4.0), lithium silicate (n=4.8-8.5), etc. In addition, illustrative examples of silicates having water coordinated therewith are concentrated solutions of $Na_2O.(SiO_2)_{3.75}.xH_2O$ where x is 5 or 9, $K_2O.(SiO_2)_{2.1}.5H_2O$, $K_2O.(SiO_2)_{2.5}.H_2O$, $Li_2O.(SiO_2)_{8.5}.9H_2O$, etc. containing various proportions of water. Hydrated silicate compositions have a better solubility than anhydrous silicate compositions, and are therefore preferred.

Specific examples of silicates represented by the general formula (II) include those described in Japanese patent application (OPI) No. 15,702/77, such as $[(CH_3)_4N]_2O.(SiO_2)_y$, $[(CH_3CH_2)_4N]_2O.(SiO_2)_y$, $[(HOCH_2)_4N]_2O.(SiO_2)_y$, $[HOCH_2CH_2)_4N]_2O.(SiO_2)_y$, $[(CH_3CH(OH))_4N]_2.(SiO_2)_y$, etc. (wherein y represents a number of from 1 to 3.2).

Specific examples of silicates represented by the general formula (III) are those described in Japanese patent application (OPI) No. 94,705/74, such as $(Li_2O.[(HOCH_2CH_2)_4N]_2O)_2.(SiO_2)_{20}$, etc. Silicates represented by the general formula (III) can be used as an aqueous solution or a solution using water as a dispersing medium.

Of these compounds, those represented by the general formula (I) are preferred, and the compounds represented by the general formula (I) wherein M is a sodium or potassium atom are most preferred.

The amount of the first component in the desensitizer of the present invention for lithographic printing plates is about 0.4 wt % to about 40 wt %, preferably about 2 wt % to about 25 wt %, based on the total weight of the desensitizer composition.

The second component of the desensitizer of the present invention for lithographic printing plates is at least one wetting agent. Any compound functioning as a wetting agent can be used. Examples of wetting agents include nonionic surface active agents, alkylene and polyalkylene glycols and alkane tri- or higher polyols. This second component functions as a wetting agent providing the desensitizer with good spreading properties when the desensitizer is applied to the surface of the lithographic printing plate, which suitably controls the degree of drying to maintain the hydrophilicity and prevent stains, and which imparts a property such that, when printing is started, the components of the desensitizer other than water are easily removed from the printing images with an oily printing ink.

Suitable wetting agents which can be used in this invention include nonionic surface active agents, alkylene and polyalkylene glycols and alkane tri- or higher polyols. Agents usable in the present invention are water-soluble compounds and, preferably, they themselves are hygroscopic. Specific examples of nonionic surface active agents are polyethylene glycol alkyl ethers, polyethylene glycol alkylphenyl ethers, polyethylene glycol esters, sorbitan monoalkyl esters, phosphoric acid esters of alkanols, and phosphoric acid esters of monohydroxyethers.

Examples of each of these classes are set forth in detail below.

The alkylene and polyalkylene glycols can be represented, for example, by the general formula $$HO\text{-}(C_zH_{2z}O)_{\overline{a}}H$$

wherein z represents an integer of 1 to 6, and a represents an integer of 1 to about 500 and, specific examples thereof include ethylene glycol, propylene glycol, butylene glycol, pentanediol, hexylene glycol, trimethylene glycol, tetramethylene glycol, pentamethylene glycol, hexamethylene glycol, heptamethylene glycol, octamethylene glycol, decamethylene glycol, diethylene glycol, triethylene glycol, tetraethylene glycol, dipropylene glycol, tripropylene glycol and polyethylene glycol.

Polyethylene glycol alkyl ethers include monoalkyl ethers and dialkyl ethers, with the polymerization degree of the ethylene glycol being in the range of from 5 to about 30 and the alkyl moiety thereof having 12 to 25 carbon atoms. Polyethylene glycol alkylphenyl ethers include monoalkylphenyl ethers and dialkylphenyl ethers, with the polymerization degree of the ethylene glycol being in the range of 5 to about 30 and the alkylphenyl moiety thereof being a phenyl group substituted with an alkyl group having 1 to 12 carbon atoms. Specific examples thereof are polyethylene glycol p-(6-methylheptyl)phenyl ether, nonylphenyl ether, and octylphenoxypolyethoxyethanol.

Polyethylene glycol esters include monoesters and diesters, with the polymerization degree of the ethylene glycol being in the range of from 5 to about 30 and with the alkyl group being that of a saturated fatty acid having 12 to 30 carbon atoms.

Specific examples of phosphoric acid esters of alkanols include phosphoric acid esters of hexanol, octanol and decanol.

Specific examples of phosphoric acid esters of monohydroxyethers are phosphoric acid esters of 2-octyloxyethanol and 2-decyloxyethanol.

Examples of alkane tri- or higher polyols (hereinafter simply "alkanepolyols") are those having three or more hydroxy groups, and specific examples thereof include glycerin, diglycerin, pentaerythritol, dipentaerythritol, tripentaerythritol, mannitol, dulcitol, and sorbitol.

Of these classes of compounds for component (II), alkane tri- or higher polyols having 3 or more hydroxy groups and alkylene and polyalkylene glycols are preferred. Specific preferred examples include glycerin, pentaerythritol, sorbitol, mannitol, dulcitol, ethylene glycol, diethylene glycol, propylene glycol, tetramethylene glycol, pentamethylene glycol, hexamethylene glycol, heptamethylene glycol and octamethylene glycol, with hexamethylene glycol, diethylene glycol and glycerin being most preferred.

These compounds can be used, if desired, individually or as a combination of two or more thereof.

A suitable amount of the second component in the desensitizer of the present invention is about 3 wt % to about 30 wt %, preferably from about 7 wt % to about 20 wt %, based on the total weight of the desensitizing composition.

The third component of the desensitizer of the present invention is a hydrophilic colloid material. This hydrophilic colloid material functions as a binder for the components other than water in the desensitizer, renders the lithographic printing plate surfaces hydrophilic and, at the same time, exhibits a weak affinity for oily ink-receptive printing images and an oily printing ink and, when printing is started, serves to remove solid ingredients in the desensitizer from the printing images.

Suitable hydrophilic colloid materials which can be used include the high molecular weight compounds described in *Hydrophilic Polymers*, Kagaku Kogyo-Sha Co., Ltd., Tokyo (1973), *Water-Soluble Resins*, compiled by R. L. Davidson & M. Sittig, Van Nostrand-Reinhold Co., New York (1968), Japanese Pat. No. 5,093/60, etc.

Specific examples of hydrophilic colloid materials which can be used include cellulose derivatives such as methyl cellulose, ethyl cellulose, carboxymethyl cellulose, carboxyethyl cellulose, ethyl hydroxyethyl cellulose, ethyl methyl cellulose, hydroxymethyl cellulose, hydroxyethyl cellulose, hydroxypropyl cellulose, hydroxyethyl methyl cellulose, hydroxypropyl methyl cellulose, sodium carboxymethyl cellulose, sodium carboxymethyl hydroxyethyl cellulose, sodium cellulose sulfate, etc., gum arabic, dextrin, shellac, alginates, polyvinyl pyrrolidone, polyvinyl alcohol and derivatives thereof, polyacrylamide and copolymers thereof, acrylic acid copolymers, vinyl methyl ether/maleic anhydride copolymers, vinyl acetate/maleic anhydride copolymers, styrene/maleic anhydride copolymers, etc. These hydrophilic colloid materials can be used individually or in combination.

A suitable amount of the water-soluble colloid material is in the range of from about 0.1 wt % to about 20 wt %, preferably from about 0.4 wt % to about 15 wt %, based on the total weight of the desensitizer composition.

The fourth component of the desensitizer for lithographic printing plates of the present invention is water. Water functions as a solvent for the desensitizer. Distilled water, deionized water, water from which solids have been filtered off, or city water can be used. Water is present in the desensitizer as the balance and the amount of water will be dependent on the amount of the other components present. However, water is preferably present in an amount of from about 40 wt % to about 90 wt % based on the total weight of the components of the desensitizer.

If desired, the following additional components can also be present in the desensitizer of the present invention for lithographic printing plates: (5) at least one member selected from the group consisting of molybdic acid, boric acid, nitric acid, phosphoric acid, polyphosphoric acid, and the water-soluble alkali metal salts and ammonium salts thereof; and (6) an anionic surface active agent.

The fifth component functions to prevent stains in the background due to the desensitizer and functions to enhance and maintain the hydrophilicity of the non-image areas of a lithographic printing plate. Only those materials which do not react with the other components present in the desensitizer to form precipitates or which do not cause a phenomenon such as gellation or the like can be used as the fifth component. Such phenomenon have been found not to occur when the above-described acids, and the water-soluble alkali metal salts and the water-soluble ammonium salts thereof are employed.

Specific examples of compounds which can be used as the fifth component are as follows.

Suitable molybdic acid salts are lithium molybdate, sodium molybdate, potassium molybdate, ammonium heptamolybdate [$(NH_4)_6Mo_7O_{24}.4H_2O$], sodium phosphomolybdate ($Na_3PO_4.12MoO_3$), ammonium phosphomolybdate [$(NH_4)_3PO_4.12MoO_3.3H_2O$], etc. Suitable boric acid salts include lithium metaborate ($LiBO_2.2H_2O$), sodium metaborate ($NaBO_2$), sodium tetraborate ($Na_2B_4O_7.10H_2O$), sodium decaborate ($Na_2B_{10}O_{16}.10H_2O$), sodium perborate ($NaBO_2.H_2O_2.3H_2O$), sodium borate/hydrogen peroxide adduct ($Na_2B_4O_7.H_2O_2.9H_2O$), sodium borate formate ($NaH_2BO_3.2HCOOH.2H_2O$), potassium metaborate ($KBO_2$), potassium tetraborate ($K_2B_4O_7.5H_2O$), ammonium tetraborate [$(NH_4)_2B_4O_7.4H_2O$], ammonium biborate [$(NH_4)HB_4O_7.3H_2O$], etc. Suitable phosphoric acid salts are trisodium phosphate, disodium phosphate, sodium dihydrogenphosphate, potassium phosphate, potassium hydrogenphosphate, potassium dihydrogenphosphate, sodium pyrophosphate, potassium pyrophosphate, potassium metaphosphate, sodium polymetaphosphate, potassium polymetaphosphate, sodium polyphosphate, potassium polyphosphate, etc. and, suitable nitric acid salts include lithium nitrate, sodium nitrate, ammonium nitrate, etc. The fifth component can be present in an amount of from about 0.01 wt % to about 10 wt %, preferably from about 0.2 wt % to about 5 wt %, based on the total weight of the desensitizer of the present invention for lithographic printing plates.

The sixth component, the anionic surface active agent, functions to make up for and increase the action of the second component of the nonionic surface active agent and/or the alkanepolyol. Suitable anionic surface active agents which can be used are aliphatic carboxylic acid salts, higher alcohol sulfuric acid ester salts, aliphatic alcohol phosphoric acid ester salts, sulfonates of carboxylic fatty acid esters, sulfonates of fatty acid amides, alkylarylsulfonic acid salts, sulfofatty acid alkyl esters, formaldehyde-naphthalenesulfonate condensates, etc. These anionic surface active agents can be present in an amount of about 15 wt % or less, preferably 10 wt % or less, based on the total weight of the desensitizer.

If desired, colloidal particles of, for example, colloidal silica having a mean particle size of about 5 nm to about 30 nm, dyes, or the like can be incorporated in the desensitizer of the present invention within an amount that the functions as a desensitizer are not impaired.

The process for preparing a lithographic printing plate using the desensitizer of the present invention is described in detail below.

The desensitizer of the present invention can be used with lithographic printing plates having formed thereon printing images, which are prepared by imagewise exposing and developing any kind of light-sensitive lithographic printing plate materials. Of these light-sensitive lithographic printing plate materials, those wherein printing images comprise areas of a photo-hardened light-sensitive layer are particularly suitable. Suitable examples of hardenable light-sensitive layers include a light-sensitive layer, e.g., as disclosed in U.S. Pat. Nos. 3,353,955 and 3,770,438, which, upon irradiation with actinic light, is hardened and becomes insoluble in a solvent for the developer and an oily printing ink and is oily printing ink-acceptive, represented by a light-sensitive layer comprising a photo-polymerizable photopolymer (photopolymerizable resin composition) containing a polymerizable compound having an ethylenically unsaturated double bond therein, a photo-polymerization initiator, and, if necessary, a binder polymer; a light-sensitive layer comprising a photo-cross linking type photo-polymer containing a photo-cross linkable low molecular weight compound or polymer (light-sensitive polymer), e.g., as disclosed in U.S. Pat. No. 3,860,426; and a light-sensitive layer comprising a diazo type photo-polymer containing a diazonium compound or a polymer having a diazonium compound residue. In addition, a silver-containing gelatino-silver halide photographic emulsion layer having been hardened through tanning development or another treatment (a treatment for hardening the emulsion layer through a treatment other than development, or a heating treatment), or a light-sensitive layer capable of forming a hardened emulsion layer can be used.

Examples of light-sensitive lithographic printing plate materials having a photo-hardenable light-sensitive layer as described above include those of the type which are to be developed using a solvent (or a developer), and those of the peel-apart developing type (containing a photopolymerizable photo-polymer layer, a photo-cross linking type photo-polymer layer or a diazo-type photo-polymer as a light-sensitive layer).

The desensitizer of the present invention is particularly suitable for preparing lithographic printing plates using peel-apart developing type light-sensitive lithographic printing plates and, of these, the desensitizer is most suitable for a lithographic printing plate which has thereon a photo-polymerizable photo-polymer layer as a light-sensitive layer.

The process of the present invention for preparing lithographic printing plates using the desensitizer of the present invention will be described by reference to a typical process for preparing lithographic printing plates using a peel-apart developing type lithographic printing plate material employing a photo-polymerizable photopolymer layer as a photo-hardening light-sensitive layer, which comprises imagewise exposing the printing plate material to actinic light, peel-apart developing the imagewise exposed printing plate material to form a lithographic printing plate with a printing image comprising a photo-polymer layer which has been hardened and has become insoluble in a solvent for the developer and an oily printing ink, then applying the desensitizer of the present invention for lithographic printing plates to the entire surface of the lithographic printing plate with the printing image, and irradiating the entire surface of the lithographic printing plate with actinic light.

Suitable examples of photo-polymerizable photopolymers (photo-polymerizable resin compositions) which can be used are the photo-polymerizable photopolymers described in Japanese patent application (OPI) Nos. 46,315/75 and 9,501/77, British Pat. No. 1,459,563, U.S. Pat. No. 4,058,398, etc. Specific examples of peel-apart developable lightsensitive lithographic printing plate materials which can be used are those which are prepared by providing a photo-polymerizable photo-polymer in a thickness of from about 2 $\mu$m to about 10 $\mu$m on a surface-grained and anodicallyoxidized aluminum plate, and laminating thereon a thin film of, e.g., polyethylene terephthalate, etc. (e.g., as a cover film to be peeled apart; thickness: about 6 $\mu$m to about 25 $\mu$m). When these materials are imagewise exposed at room temperature through the peel-apart cover film using actinic light and then the peel-apart cover film is peeled apart from the material, a printing image comprising a polymerized and hardened photopolymerizable photo polymer is formed on the aluminum support.

The actinic light can be light of an optional wavelength or wavelength region and can be selected from near ultraviolet light and visible light of a wavelength from about 290 nm to about 650 nm. Imagewise exposure and peel-apart development are described in detail in the above-described specifications.

In the process of the present invention for preparing lithographic printing plates, irradiation of a lithographic printing plate with actinic light under heating immediately after coating the desensitizer of the present invention (this treatment being called "gumming") to the entire surface of the peel-apart developed lithographic printing plate is preferred since such irradiation under heating strengthens the image. The effect of this heating is the same as described in Japanese patent application (OPI) No. 15,906/78 applies and, further, an additional effect has been discovered. That is, when the lithographic printing plate material is heated to a suitable temperature upon gumming the peel-apart developed material with the desensitizer of the present invention, the desensitizer is easily dried and, in addition, the reaction of imparting hydrophilicity by the alkali silicate present in the desensitizer is activated. Therefore, a greater hydrophilicity-imparting effect can be obtained.

The desensitizer of the present invention exhibits the effects obtained by conducting both desensitizing and gumming treatments, and may be called a "desensitizer gum solution", and lithographic printing plates which have been treated according to the process of the present invention using the desensitizer of the present invention have the same properties as those of lithographic printing plates which have been subjected to both a desensitizing treatment and a gumming treatment.

Any heating method such as a method using a heated roll, a hot blast method, contacting with a hot plate, or an infrared light-irradiation method can be employed as long as the heating necessary can be achieved.

In particular, a method utilizing the heat generated from a light source (or apparatus) emitting actinic light is a practically advantageous method.

The heating temperature in the heating as described above will vary depending upon the kind of light-sensitive composition used, but the temperature must be within a range where the light-sensitive composition in the unexposed areas does not undergo a polymerization or hardening due to the heating. In general, the heating can be conducted within the range of from about 40° C. to about 150° C.

Similarly, the heating time will vary depending upon the kind of light-sensitive composition used as with the heating temperature and, in addition, upon the intensity of the actinic light to be used, but the time must be within the range where the unexposed light-sensitive composition does not undergo polymerization or hardening by heat alone. In general, the heating time is in the range of from about 0.1 second to about 5 minutes and, more preferably, from about 3 seconds to about 1 minute.

The actinic light used for the heating in the present invention can be light of an optional wavelength (or wavelength region) from near ultraviolet light to visible light of a wavelength from about 290 nm to about 650 nm. The light source for the actinic light can be a low-pressure mercury lamp, a high-pressure mercury lamp, a super-high pressure mercury lamp, a fluorescent lamp emitting ultraviolet light, a carbon arc lamp, a xenon lamp, sunlight, etc.

The irradiation time can be shortened by increasing the power of the light source emitting the actinic light, and the same heating time as described above is preferable from the point of view of treating procedures.

The lithographic printing plate prepared by gumming with the desensitizer of the present invention for lithographic printing plates has the advantage that printing can be started using an oily printing ink without specifically removing the desensitizer coating (gum coating)

on the lithographic printing plate when printing is started. In addition, the non-printing image areas on the lithographic printing plate have increased hydrophilicity, the oily ink-receptivity of the printing image areas is not degraded and the properties upon starting of printing are improved.

The present invention is now illustrated in more detail by reference to the following non-limiting examples thereof. Unless otherwise indicated, all parts, percents, ratios and the like are by weight.

EXAMPLE 1 AND COMPARATIVE EXAMPLE 1

A 2S aluminum plate for a lithographic plate which had been mechanically grained (an alloy plate comprising 99% aluminum, 0.6% magnesium, and 0.4% silicon) was dipped for 1 minute in a 2 wt % NaOH aqueous solution maintained at 40° C. to partly etch the surface. After washing, the plate was dipped for 1 minute in a sulfuric acid-chromic acid aqueous solution to lay bare a pure aluminum surface, and dipped in a 20% sulfuric acid aqueous solution maintained at 30° C. and subjected to an anodic oxidation treatment for 2 minutes under the conditions of a DC potential of 15 V and a electric current density of 3 $A/cm^2$.

Then, the aluminum plate was dipped for 90 seconds in a 2.0 wt %, 60° C. sodium molybdate aqueous solution, followed by drying.

Separately, the following compositions was dissolved in a mixture of 100 ml of methyl ethyl ketone and 20 ml of dimethylformamide to prepare a light-sensitive composition solution.

| | |
|---|---|
| Chlorinated Polyethylene (Superchlon CPE-907LTA*; made by Sanyo Kokusaku Pulp Co., Ltd.) | 10 g |
| Pentaerythritol Trimethacrylate | 10 g |
| 2-Methylanthraquinone | 0.2 g |
| Hydroquinone | 0.1 g |
| Copper-Phthalocyanine Pigment | 0.2 g |

(*Superchlon CPE-907LTA is a compound having a viscosity of about 90 cps in a 40 wt % toluene solution at 25° C. and containing 66 wt % or more chlorine.)

This light-sensitive composition solution was coated on the surface of the aluminum plate prepared as described above using a rotary coater (thickness of the light-sensitive layer after removing the solvent: 4 μm), and dried at 80° C. for 7 minutes. Then, a 12 μm-thick polyethylene terephthalate film was press-laminated onto the light-sensitive composition layer to produce a light-sensitive lithographic printing plate material.

Thereafter, the light-sensitive lithographic printing plate material was imagewise exposed for 17 seconds through a negative film using a PS light S type (metal halide lamp; 2 KW; made by Fuji Photo Film Co., Ltd.) spaced at a distance of 1 m. Upon peeling apart the polyethylene terephthalate film immediately after the exposure, a photo-hardened positive image was formed on the aluminum plate, whereas unhardened areas (unexposed areas) were removed together with the polyethylene terephthalate film.

Then, this lithographic printing plate was divided into 10 plates, and they were gummed with the following desensitizers, respectively.

TABLE 1

| Formulation of Desensitizer | |
|---|---|
| Comparative Example - Desensitizer (C-1) | |
| Distilled Water | 1000 ml |
| Gum Arabic (powder) | 150 g |
| Sodium Molybdate | 5 g |
| Wetting Agent (Zonyl-A; modified ethylene oxide condensate; produced by du Pont) | 1.25 g |
| Phosphoric Acid (85 wt % aqueous solution) | 10 ml |
| Glycerin | 40 g |
| Glyoxal | 21 g |
| Comparative Example - Desensitizer (C-2) | |
| Ammonium Polyacrylate (10 wt % aqueous solution) (A-30; made by Toa Gosei Chemical Industry Co., Ltd.) | 100 g |
| Water | 200 g |
| Comparative Example - Desensitizer (C-3) | |
| Ammonium Dichromate [$(NH_4)_2Cr_2O_7$; 20 wt % aqueous solution] | 80 ml |
| Phosphoric Acid (85 wt % aqueous solution) | 30 ml |
| Gum Arabic (powder) | 100 g |
| Water | 1000 ml |
| Comparative Example - Desensitizer (C-4) | |
| Ammonium Phosphate | 30 g |
| Phosphoric Acid (85 wt % aqueous solution) | 40 ml |
| Gum Arabic (powder) | 120 g |
| Water | 1200 ml |
| Comparative Example - Desensitizer (C-5) | |
| Carboxymethyl Cellulose (Cellogen 7A, mean polymerization degree: 120-150; mean molecular weight: 27,000-33,000; made by Dai-ichi Kogyo Seiyaku Co., Ltd.) | 50 g |
| Ammonium Nitrate | 50 g |
| Phosphoric Acid (85 wt % aqueous solution) | 20 g |
| Water | 1000 ml |
| Example - Desensitizer (1) | |
| Polyvinyl Alcohol (Gohsenol PVA-NH20; polymerization degree: 1000; saponification degree: 98.5-99.4 mol %; made by Nippon Synthetic Chemical Industry Co., Ltd.) | 20 g |
| JIS #1 Sodium Silicate (about 55 wt % aqueous solution; molar ratio of $SiO_2/Na_2O$: 2.1-2.3; $SiO_2$ content: 36-38% $Na_2O$ content: 17-18%) | 100 g |
| Glycerin | 120 g |
| Sodium Metaborate | 3 g |
| Water | 1200 g |
| Example - Desensitizer (2) | |
| Polyvinyl Pyrrolidone (K-30; mean molecular weight: 40,000; made by Tokyo Kasei Kogyo Co., Ltd.) | 15 g |
| JIS #3 Sodium Silicate (about 40 wt % aqueous solution; molar ratio of $SiO_2/Na_2O$: 3.1-3.3; $SiO_2$ content: 28-30%; $Na_2O$ content: 9-10%; made by Nippon Synthetic Chemical Industry Co., Ltd.) | 90 g |
| Hexamethylene Glycol | 50 g |
| Glycerin | 50 g |
| Sodium Dihydrogenphosphate | 4 g |
| Water | 900 ml |
| Example - Desensitizer (3) | |
| Carboxymethyl Cellulose (Cellogen 7A) | 10 g |
| JIS #3 Sodium Silicate | 100 g |
| Glycerin | 110 g |
| Sodium Molybdate | 4 g |
| Water | 750 ml |
| Example - Desensitizer (4) | |
| Carboxymethyl Cellulose (Cellogen 7A) | 20 g |

TABLE 1-continued

| Formulation of Desensitizer | |
|---|---|
| Colloidal Silica (LUDOX-AM; mean particle size: 13-nm; pH at 25° C.: 9.0; $SiO_2/Na_2O$ weight ratio: 230; $SiO_2$ content: 30.0 weight %; stabilizing ion: $Na^{\oplus}$) | 20 g |
| Diethylene Glycol | 40 g |
| Glycerin | 80 g |
| Water | 600 ml |
| Example - Desensitizer (5) | |
| Vinyl Methyl Ether/ Maleic Anhydride Copolymer | 25 g |
| Amine Silicate Silica Sol (40 wt % aqueous solution; QAS-40; made by Nissan Chemical Industries Co., Ltd.) | 145 g |
| Ethylene Glycol | 50 g |
| Potassium Nitrate | 3 g |
| Water | 700 ml |

The ten samples gummed with Desensitizers (C-1) to (C-5) or Desensitizers (1) to (5) were conveyed at a speed of 30 mm/sec while irradiating the entire surfaces thereof using a 2 KW high-pressure mercury lamp (ORC-AHH-2000/C; made by ORC Mfg. Co., Ltd.) spaced at a distance of 15 cm (light intensity on the plate surface being within the range of from about 1000 to about 1450 $\mu$W per/$cm^2$).

In order to examine stains in the non-image areas of the 10 samples thus-obtained, the entire surfaces of the 10 samples were rubbed with a sponge having thereon a developing ink of the following formulation to evaluate the adhesion of the developing ink on the printing plates (developing ink adhesion test). Where the non-image areas of the lithographic printing plates were oleophilic, the developing ink adhered to the non-image areas, and hence the effects of the desensitizer can be determined by conducting the developing ink adhesion test after gumming with the desensitizer.

| Formulation of Developing Ink: | |
|---|---|
| Transfer Ink | 35 g |
| Asphalt | 8 g |
| Marseilles Soap | 9 g |
| Oleic Acid | 9 g |
| Turpentine Oil | 870 g |
| Benzene | 260 g |

Then printing was conducted as described below using the 10 samples which had been subjected to the developing ink test.

| Printing | | |
|---|---|---|
| Printing Machine: | HEIDELBERG SORK-Z (made by HEIDELBERG PRINTING PRESS CO., LTD., West Germany) | |
| Printing Ink: | Toyo Web Kind (made by Toyo Ink Mfg. Co., Ltd.) | |
| Printing Speed: | 5,000 sheets/hr | |
| Damping Water: | A stock solution* was diluted with water to obtain a 3 % aqueous solution. | |
| Formulation of Stock Solution* for Damping Water: | | |
| Gum Arabic (powder) | | 120 g |
| Phosphoric Acid (85 wt % aqueous solution) | | 30 ml |
| Ammonium Dichromate | | 30 g |
| Water | | 1500 ml |

"Stains on the printing plates" and "background stains of the prints" were evaluated by observing the non-image areas of the printing plates and a print after printing 1000 sheets of prints. The results are indicated in terms of the following grades.

E—excellent (no stains were observed, and distinct prints were obtained)

G—good (slight stains were observed only by careful observation, and sufficiently usable prints were obtained)

B—bad (stains were observed, and the prints were not practically usable)

TABLE 2

| Desensitizer Used for Gumming | Stains with Developing Ink | Stains of Printing Plate | Stains of Resulting Prints |
|---|---|---|---|
| Comparative Example | | | |
| (C-1) | B | B | B |
| (C-2) | B | B | B |
| (C-3) | B | B | B |
| (C-4) | B | B | B |
| (C-5) | B | B | B |
| Example | | | |
| (1) | E | E | E |
| (2) | E | E | E |
| (3) | E | E | E |
| (4) | G | G | G |
| (5) | G | G | G |

From the above results, it is clear that, in the case of developing, gumming and irradiating with actinic light (post exposure) the peel-apart developable type lithographic printing plate material, Desensitizers (C-1) to (C-5) known as desensitizers failed to provide the effects of the present invention and only the desensitizers of the present invention, (1) to (5), enabled the effects of the present invention to be attained.

EXAMPLES 2 AND 3, AND COMPARATIVE EXAMPLES 2 AND 3

A 3S aluminum plate for a lithographic printing plate (aluminum alloy plate comprising 1.2% manganese and 98.8% aluminum) was dipped for 5 minutes in a 70° C., 5% sodium tertiary phosphate aqueous solution in order to remove oils adhered to the surface upon rolling and to clean the surface. Some etching was caused by this treatment, resulting in an increase of water-retention properties. This plate was then dipped, after washing with water, in a 70% nitric acid aqueous solution. After washing the aluminum plate well with water, the plate was grained with carborundum and washed with water.

This aluminum plate was subjected to an anodic oxidation for 2 minutes at 50° C. in a 20% sulfuric acid aqueous solution under the conditions of a D.C. current density of 3 A/$cm^2$ and, after washing the aluminum plate with water and drying, dipped for 2 minutes in a 1% phosphoric acid aqueous solution heated to 70° C. After washing the plate with water, a 1.0% aqueous solution of polyvinyl pyrrolidone (K-30) was coated thereon using a whirler coating machine, and dried.

Separately, the following composition was dissolved in a mixture of 100 ml of 1,2-dichloroethane and 40 ml of monochlorobenzene to prepare a light-sensitive composition solution.

| | |
|---|---|
| Chlorinated Polyethylene (Superchlon CPE-907LTA) | 8 g |
| Pentaerythritol Trimethacrylate | 10 g |
| 2-Methylanthraquinone | 0.2 g |
| Hydroquione | 0.1 g |
| Copper-Phthalocyanine Pigment | 0.2 g |
| Epiol G 100 (main component: triglycidyl ether of glycerin; specific gravity at 20° C.: 1.23; made by Nippon Oils & Fats Co., Ltd.) | 0.02 g |

This light-sensitive coating solution was coated on a polyethylene terephthalate film of a thickness of 12 μm and dried for 10 minutes at 80° C. The thickness of the coating layer after drying was 4 μm. Then, the film was press-laminated on the aluminum plate, which had previously been surface-treated and subbed with the hydrophilic high molecular compound described above, with the light-sensitive composition layer adjacent the aluminum plate.

An original image was closely superposed on the polyethylene terephthalate film of the light-sensitive lithographic printing plate material, and the plate material was imagewise exposed for 20 seconds through the original image and the polyethylene terephthalate film using a PS light S type spaced at a distance of 1 m. Upon immediately peeling apart the polyethylene terephthalate film, a photo-hardened positive image (for printing) was formed on the aluminum plate, and the non-hardened areas (unexposed areas) were removed together with the polyethylene terephthalate film to provide a lithographic printing plate.

Then, this lithographic printing plate was divided into 4 samples, and they were subjected to the four treatments, respectively, as illustrated in FIG. 1 in the same manner as described in Example 1.

Printing was conducted according to lithographic direct printing under the following conditions.

Printing Machine: Davidson Dualith 700

Printing Ink: Sakata AOP India Ink for off-set rotary printing (made by Sakata Co., Ltd.)

Printing Speed: 4000 sheets/hr

Damping Water: V-2020 (an alkaline damping water; made by Flint Ink Corporation) was diluted 100 times with water.

"Background stains of the prints" were evaluated in the same manner as described in Example 1. "Stain-preventing effect" was rated as follows: after obtaining 1000 sheets of normal impressions in a stain-free state, the damping roller was removed and, after inking the entire surface and allowing the plate to stand for 1 hour, printing was again conducted to print 100 sheets of prints and whether stains were formed on the 100th print was determined.

The printing results obtained using the lithographic printing plates thus-obtained are shown in Table 3 below.

TABLE 3

| Example No. | Print | Treatment: Desensitizer | Treatment: Post-exposure | Background Stains | Stain-Preventing Effect | Durability (Number of printable sheets) | Overall Evaluation |
|---|---|---|---|---|---|---|---|
| Ex.2 | (2A) | (3) | No | G | G | 60,000 | G |
| Ex.3 | (3A) | (3) | Yes | G | G | >140,000 | E |
| Comp. Ex.2 | (2C) | (C-1) | No | G | P | 60,000 | P |
| Comp. Ex.3 | (3C) | (C-1) | Yes | B | B | — | B |

The symbols in the above table had the following meanings.
E : excellent (practically usable)
G : good (practically usable)
P : poor (practically usable for some end-uses)
B : bad (not practically usable)

From the results shown in Table 3 above, it is clear that the lithographic printing plates which had been treated using Desensitizer (3) of the present invention did not generate printing stains, but showed stain-preventing effects and exhibited extremely excellent durability after post-exposure.

EXAMPLE 4

In the same manner as described in Example 1 except for treating the aluminum support with a 3% aqueous solution of JIS #3 sodium silicate (immersion for 120 seconds at 60° C. ) in place of sodium molybdate, an aluminum plate was was prepared. As a light-sensitive composition, the following was used.

| | |
|---|---|
| 1,6-Dichloroethane | 160 g |
| Chlorinated Polyethylene (Elaslen-401A*; made by Showa Denko K.K.) | 15 g |
| Pentaerythritol Methacrylate | 20 g |
| 1-Methyl-2-benzoylmethylene-β-naphthothiazoline | 0.3 g |
| p-Methxyphenol | 0.2 g |
| Copper-Phthalocyanine Pigment | 0.1 g |
| Epiol G 100 | 0.03 g |

(*Elaslen-401A; a compound having a chlorine content of 40 %, a specific gravity of 1.20, and a Mooney viscosity (MS4'100° C.) of 80.)

The solution of the above-described light-sensitive composition was coated on the previously prepared aluminum plate in a dry weight of 5.4 g/m$^2$ and, after drying, a polyethylene terephthalate film having a thickness of 20 μm was laminated thereon to prepare a light-sensitive lithographic printing plate material.

Thereafter, this light-sensitive lithographic printing plate material was imagewise exposed for 12 seconds at 25° C. through a negative film using a PS light S type spaced at a distance of 1 m. Upon immediately peeling apart the polyethylene terephthalate film, a photo-hardened positive printing image was formed on the aluminum plate, whereas the non-hardened areas (unexposed areas) were removed together with the polyethylene terephthalate film. The lithographic printing plate thus-obtained was gummed with Desensitizer (3), and the entire image surface was irradiated for 1 minute (post-exposure) using a PS light S type spaced at a distance of 0.6 m.

Figure 2:
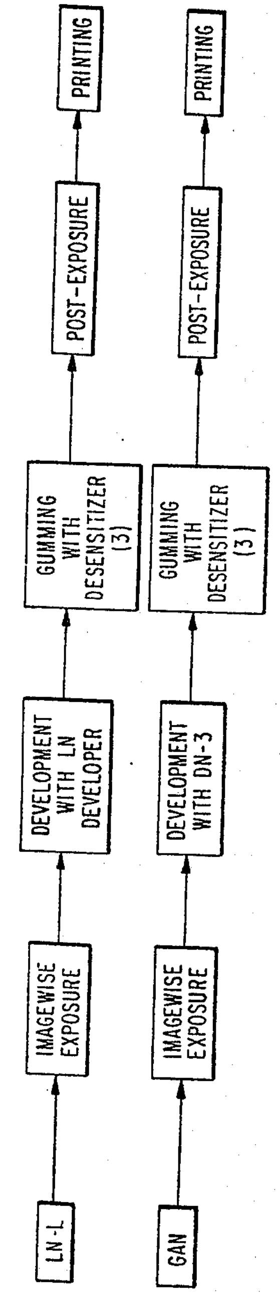

On the other hand, in order to test the adaptability of the desensitizer gum solution of the present invention for ordinary PS plates, KODAK POLYMATIC LITHO PLATE LN-L (an anodized aluminum plate having thereon a layer of photo-crosslinkable polymer, made by Eastman Kodak Co., USA) and GAN PS plate (a grained and anodized aluminum plate having thereon a light-sensitive layer containing a diazo resin and a binder, made by Fuji Photo Film Co., Ltd.) were selected and, after imagewise exposure for 30 seconds using the PS light S type spaced at a distance of 1 m, were subjected to the treatments shown in FIG. 2 in the same manner as with the peel-apart developable materials in Example 3, and printing testing was conducted under the same conditions as in Example 2. The results obtained are shown in Table 4 below.

TABLE 4

| Lithographic Printing Plate | Stains on Printing Plate | Background Stains | Stain-Preventing Effect | Overall Evaluation |
|---|---|---|---|---|
| Peel-apart type | G | G | G | G |
| PS Plate | | | | |
| LN | G | G | G | G |
| GAP | G | G | G | G |

G : good (practically usable)

From the results in Table 4 above, it is clear that the desensitizer of the present invention is sufficiently applicable to conventional PS plates as well.

While the invention has been described in detail and with reference to specific embodiments thereof, it will be apparent to one skilled in the art that various changes and modifications can be made therein without departing from the spirit and scope thereof.

What is claimed is:

1. A process for preparing a lithographic printing plate, which comprises:

imagewise exposing a light-sensitive lithographic printing plate material having a photo-hardenable light-sensitive layer thereon using actinic light, peel-apart developing the exposed lithographic printing plate material to produce a lithographic printing plate having an oily ink-receptive printing image, applying a desensitizer for a lithographic printing plate to the entire surface of the lithographic printing plate bearing said printing image, said desensitizer comprising (i) at least one silicate represented by general formula (I), (II) and (III)

$$M_2O.(SiO_2)_n.qH_2O \quad (I)$$

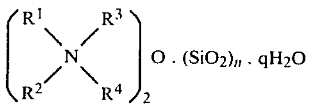

(II)

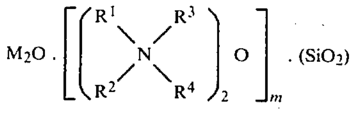

(III)

wherein M represents an alkali metal atom; $R^1$, $R^2$, $R^3$ and $R^4$, which may be the same or different, each represents a hydrogen atom, an alkyl group or a hydroxyalkyl group; n represents a number of from 1 to 8.5; q represents a number of from 1 to 12; m represents a number of greater than 0 and up to 10; and p represents a number of from 4 to 5000;

(ii) at least one wetting agent;

(iii) a hydrophilic high molecular weight compound which is at least one member selected from the group consisting of methyl cellulose, ethyl cellulose, carboxymethyl cellulose, carboxyethyl cellulose, ethyl hydroxyethyl cellulose, ethyl methyl cellulose, hydroxymethyl cellulose, hydroxyethyl cellulose, hydroxypropyl cellulose, hydroxyethyl methyl cellulose, hydroxyethyl methyl cellulose, hydroxypropyl methyl cellulose, sodium carboxymethyl cellulose, sodium cellulose sulfate, dextrin, shellac, an alginate, polyvinyl pyrrolidone, polyvinyl alcohol, polyacrylamide or a copolymer thereof, an acrylic acid copolymer, a vinyl methyl ether/maleic anhydride copolymer, a vinyl acetate/maleic anhydride copolymer or a styrene/maleic anhydride copolymer; and (iv) water, and irradiating the entire surface of said desensitizer-bearing lithographic printing plate with actinic light.

2. The process of claim 1, wherein the alkali metal atom represented by M is a lithium atom, a sodium atom, a potassium atom, a rubidium atom or a cesium atom; wherein the alkyl group represented by $R^1$, $R^2$, $R^3$ and $R^4$ is an alkyl group having 1 to 5 carbon atoms; and wherein the hydroxyalkyl group represented by $R^1$, $R^2$, $R^3$ and $R^4$ is a hydroxyalkyl group having 1 to 5 carbon atoms.

3. The process of claim 2, wherein said silicate (i) is sodium silicate, lithium silicate, potassium silicate, rubidium silicate or cesium silicate.

4. The process of claim 3, wherein said silicate is sodium silicate wherein n ranges from 2.1 to 3.3; potassium silicate wherein n is 4.0; lithium silicate wherein n ranges from 4.8 to 8.5; $Na_2.(SiO_2)_{3.75}.xH_2O$ wherein x is 5 or 9; $K_2O.(SiO_2)_{2.1}.5H_2O$; $K_2O.(SiO_2)_{2.5}.H_2O$, $Li_2O.(SiO_2)_{8.5}.9H_2O$; $[(CH_3)_4N]_2O.(SiO_2)_y$; $[(CH_3CH_2)_4N]_2O.(SiO_2)_y$; $[(HOCH_2)_4N]_2.(SiO_2)_y$; $[(HOCH_2CH_2)_4N]_2O.(SiO_2)_y$; $[(CH_3CH)(OH)_4N]_2.(SiO_2)_y$; wherein y represents a number of from 1 to 3.2 or $LiO_2.[(HOCH_2CH_2)_4N)_2O]_2.(SiO_2)_{20}$.

5. The process of claim 1, wherein said wetting agent (ii) is a nonionic surface active agent, an alkylene or polyalkylene glycol or an alkane tri- or higher polyol.

6. The process of claim 1, wherein said wetting agent is a nonionic surface active agent selected from the group consisting of a polyethylene glycol alkyl ether, a polyethylene glycol alkyl phenyl ether, a polyethylene glycol ester, a sorbitan monoalkyl ester, a phosphoric acid ester of an alkanol, and a phosphoric acid ester of a monohydroxy ether or is an alkylene or polyalkylene glycol or an alkane tri- or higher polyol.

7. The process of claim 1, wherein said wetting agent (ii) is glycerin, pentaerythritol, sorbitol, mannitol, dulcitol, ethylene glycol, diethylene glycol, propylene glycol, tetramethylene glycol, pentamethylene glycol, hexamethylene glycol, heptamethylene glycol or octamethylene glycol.

8. The process of claim 1, wherein said silicate (i) is present in an amount of about 0.4% by weight to about 40% by weight; said wetting agent (ii) is present in an amount of about 3% by weight to about 30% by weight; said hydrophilic high molecular weight compound (iii)

is present in an amount of about 0.1% by weight to about 20% by weight; and said water (iv) is present in an amount of about 40% by weight to about 90% by weight, each based on the total weight of the desensitizer.

9. The process of claim 3, wherein said silicate is sodium silicate or potassium silicate.

10. The process of claim 9, wherein said wetting agent (ii) is glycerin.

11. The process of claim 1, wherein said light-sensitive lithographic printing plate material comprises an aluminum support having thereon, in order, a photo-hardenable light-sensitive layer comprising a photopolymerizable compound having an ethylenically unsaturated double bond therein, a photopolymerization initiator and a binder polymer and a transparent cover film, wherein said developing is carried out by peeling-apart said transparent cover film to thereby remove unexposed areas of said imagewise exposed photo-hardenable layer.

12. The process of claim 10, wherein said desensitizer further contains (v) at least one member selected from the group consisting of molybdic acid, boric acid, nitric acid, phosphoric acid, polyphosphoric acid or the water-soluble alkali metal or ammonium salts thereof.

13. The process of claim 12, wherein said desensitizer further contains (vi) an anionic surface active agent selected from the group consisting of aliphatic carboxylic acid salts, higher alcohol sulfuric acid ester salts, aliphatic alcohol phosphoric acid ester salts, sulfonates of carboxylic fatty acid esters, sulfonates of fatty acid amides, alkylarylsulfonic acid salts, sulfofatty acid alkyl esters and formaldehydenaphthalenesulfonate condensates.

14. The process of claim 13, wherein said silicate (i) is present in an amount of about 0.4% by weight to about 40% by weight; said wetting agent (ii) is present in an amount of about 3% by weight to about 30% by weight; said hydrophilic high molecular weight compound (iii) is present in an amount of about 0.1% by weight to about 20% by weight; said water (iv) is present in an amount of about 40% by weight to about 90% by weight, component (v) is present in an amount of about 0.01% by weight to about 10% by weight, and said anionic surface active agent is present in an amount of about 15% by weight or less, each based on the total weight of the desensitizer.

15. The process of claim 10, wherein said irradiation is conducted while heating.

16. The process of claim 15, wherein said heating is by heat generated from a light source emitting actinic light.

17. The process of claim 15, wherein said heating is conducted within a range from about 40° C. to about 150° C., for time ranging from about 0.1 second to about 5 minutes.

* * * * *